(12) United States Patent
Rosch et al.

(10) Patent No.: US 11,276,618 B2
(45) Date of Patent: Mar. 15, 2022

(54) BI-LAYER PREPREG FOR REDUCED DIELECTRIC THICKNESS

(71) Applicant: Intel Corporation, Santa Clara, CA (US)

(72) Inventors: Jonathan Rosch, Mesa, AZ (US); Andrew J. Brown, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 805 days.

(21) Appl. No.: 15/967,122

(22) Filed: Apr. 30, 2018

(65) Prior Publication Data

US 2019/0333832 A1    Oct. 31, 2019

(51) Int. Cl.
| | |
|---|---|
| *H01L 23/14* | (2006.01) |
| *B32B 27/12* | (2006.01) |
| *B32B 5/02* | (2006.01) |
| *B32B 5/26* | (2006.01) |
| *B32B 27/38* | (2006.01) |
| *B32B 27/36* | (2006.01) |
| *H01L 23/538* | (2006.01) |

(Continued)

(52) U.S. Cl.
CPC ............ *H01L 23/145* (2013.01); *B32B 5/024* (2013.01); *B32B 5/26* (2013.01); *B32B 27/12* (2013.01); *B32B 27/36* (2013.01); *B32B 27/38* (2013.01); *H01L 21/481* (2013.01); *H01L 21/486* (2013.01); *H01L 23/5384* (2013.01); *H01L 23/5386* (2013.01); *H05K 1/0366* (2013.01); *B32B 2250/02* (2013.01); *B32B 2260/023* (2013.01); *B32B 2260/046* (2013.01); *B32B 2262/101* (2013.01); *B32B 2264/101* (2013.01); *B32B 2307/204* (2013.01); *B32B 2307/732* (2013.01); *B32B 2457/208* (2013.01); *H01L 21/4857* (2013.01); *H01L 23/49816* (2013.01); *H01L 23/5383* (2013.01); *H01L 24/16* (2013.01); *H01L 24/81* (2013.01); *H01L 25/0655* (2013.01); *H01L 2224/16227* (2013.01); *H01L 2924/14* (2013.01); *H05K 5/0017* (2013.01)

(58) Field of Classification Search
CPC ............... H01L 23/145; H01L 21/4857; H01L 23/5838; B32B 2206/023; B32B 2206/046; B32B 27/12; C08J 5/24; H05K 1/0366

See application file for complete search history.

(56) References Cited

U.S. PATENT DOCUMENTS

| | | | | |
|---|---|---|---|---|
| 5,588,207 | A | * | 12/1996 | Kawakita ............. H05K 3/4046 174/265 |
| 6,078,229 | A | * | 6/2000 | Funada .................. H03H 9/059 333/193 |

(Continued)

*Primary Examiner* — John A Bodnar
(74) *Attorney, Agent, or Firm* — Essential Patents Group, LLP.

(57) ABSTRACT

An apparatus is provided which comprises: a woven fiber layer, a first resin layer on a first surface of the woven fiber layer, a second resin layer on a second surface of the woven fiber layer, the second surface opposite the first surface, and the first and the second resin layers comprising cured resin, a third resin layer on the first resin layer, and a fourth resin layer on the second resin layer, the third and the fourth resin layers comprising an uncured resin, and wherein the fourth resin layer has a thickness greater than a thickness of the third resin layer. Other embodiments are also disclosed and claimed.

19 Claims, 7 Drawing Sheets

(51) Int. Cl.
*H01L 21/48* (2006.01)
*H05K 1/03* (2006.01)
*H01L 23/498* (2006.01)
*H05K 5/00* (2006.01)
*H01L 23/00* (2006.01)
*H01L 25/065* (2006.01)

(56) References Cited

U.S. PATENT DOCUMENTS

| | | | |
|---|---|---|---|
| 6,570,099 B1* | 5/2003 | Hirano | H01L 23/36 |
| | | | 174/258 |
| 7,253,023 B2* | 8/2007 | Kusagaya | H05K 3/4602 |
| | | | 438/106 |
| 2003/0063453 A1* | 4/2003 | Kusagaya | H05K 3/4623 |
| | | | 361/794 |
| 2005/0186768 A1* | 8/2005 | Sugaya | H05K 3/20 |
| | | | 438/597 |
| 2014/0360765 A1* | 12/2014 | Kiwanami | H01L 23/49822 |
| | | | 174/260 |
| 2016/0020165 A1* | 1/2016 | Kamgaing | H01L 23/145 |
| | | | 361/679.55 |
| 2017/0358700 A1* | 12/2017 | Kumai | H01L 31/0516 |

* cited by examiner

BI-LAYER PREPREG FOR REDUCED DIELECTRIC THICKNESS

BACKGROUND

As computing devices, such as smartphones, continue to increase in performance and capabilities, while shrinking in size, the use of thinner, coreless package substrates has expanded. Substrates designed for coreless architectures not only require space to attach devices, but also space for routing of interconnects and vias to facilitate communication with the devices. The use of a prepreg, composite fiber pre-impregnated with polymer matrix, can provide good thermomechanical performance in a relatively thin layer. However, further reducing the thickness of a prepreg material, to accommodate finer vias for example, can be problematic due to the presence of the woven fiber, which can hinder void-free resin flow over routing layers.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

DETAILED DESCRIPTION

A bi-layer prepreg for reduced dielectric thickness is generally presented. In this regard, embodiments of the present disclosure enable an asymmetrical prepreg with additional resin on a side of the prepreg that is to contact metal features of a substrate routing layer. One skilled in the art would appreciate that these prepregs may enable reduced dielectric thickness and thereby reduce via height, which could lead to improved reliability and performance.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct connection, such as electrical, mechanical, or magnetic connection between the things that are connected, without any intermediary devices. The term "coupled" means a direct or indirect connection, such as a direct electrical, mechanical, or magnetic connection between the things that are connected or an indirect connection, through one or more passive or active intermediary devices. The term "circuit" or "module" may refer to one or more passive and/or active components that are arranged to cooperate with one another to provide a desired function. The term "signal" may refer to at least one current signal, voltage signal, magnetic signal, or data/clock signal. The meaning of "a," "an," and "the" include plural references. The meaning of "in" includes "in" and "on."

Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C). The terms "left," "right," "front," "back," "top," "bottom," "over," "under," and the like in the description and in the claims, if any, are used for descriptive purposes and not necessarily for describing permanent relative positions.

Figure 1:
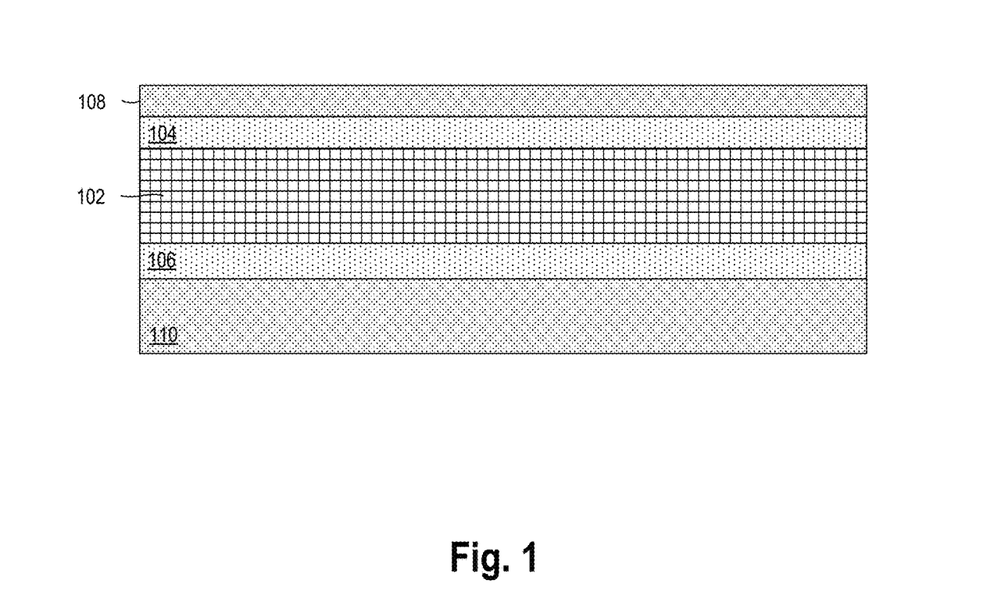
FIG. 1 illustrates a cross-sectional view of a bi-layer prepreg, according to some embodiments.

FIG. 1 illustrates a cross-sectional view of a bi-layer prepreg, according to some embodiments. As shown, prepreg 100 includes woven fiber layer 102, first resin layer 104, second resin layer 106, third resin layer 108, and fourth resin layer 110. Prepreg 100 may be formed using methods described hereinafter in relation to various embodiments, however other variations and alternatives may occur to one skilled in the art without deviating from the scope of the present disclosure. Also, prepreg 100 may include more or fewer layers than depicted while still being asymmetrical with more dielectric (resin) on one side of the woven fiber layer than the other. In some embodiments, prepreg 100 may have a total thickness of less than 40 um.

In some embodiments, woven fiber layer 102 may be a fiberglass fabric of any suitable weight or weave. In some embodiments, woven fiber layer 102 is a #1010 weave fiberglass. In other embodiments, woven fiber layer 102 may be a carbon fiber or Kevlar. In some embodiments, woven fiber layer 102 may have a thickness of less than 40 um.

In some embodiments, first resin layer 104 and second resin layer 106 are a cured epoxy resin, polyester resin, or vinyl ester resin. In some embodiments, first resin layer 104 and second resin layer 106 are a thermoset epoxy resin with silica-based filler particles. In some embodiments, first resin layer 104 and second resin layer 106 have corresponding, or substantially similar, thicknesses of less than 10 um. In some embodiments, first resin layer 104 and second resin layer 106 represent excess resin used to impregnate woven fiber layer 102 and may only extend marginally, if at all, beyond woven fiber layer 102.

In some embodiments, first resin layer 104 and/or second resin layer 106 may include bisphenol A epoxy resin, including epichlorohydrin. In some embodiments, first resin layer 104 and/or second resin layer 106 may include bisphenol F epoxy resin, including epichlorohydrin. In some embodiments, first resin layer 104 and/or second resin layer 106 may include novolac epoxy resin, such as epoxy phenol novolacs (EPN) or epoxy cresol novolacs (ECN). In some embodiments, first resin layer 104 and/or second resin layer 106 may include aliphatic epoxy resin, which may be monofunctional (e.g. dodecanol glycidyl ether), difunctional (butanediol diglycidyl ether), or higher functionality (e.g. trimethylolpropane triglycidyl ether). In some embodiments, first resin layer 104 and/or second resin layer 106 may include glycidylamine epoxy resin, such as triglycidyl-p-aminophenol (functionality 3) and N,N,N',N'-tetraglycidyl-bis-(4-aminophenyl)-methane (functionality 4).

In some embodiments, first resin layer 104 and/or second resin layer 106 may include inorganic and/or organic resin particles that are designed to strengthen the composite, decrease thermal expansion, minimized polymerization shrinkage and/or reduce the amount of swelling caused by waster absorption. In some embodiments, silica-based filler particles may include homogeneous or heterogeneous, pyrogenic or colloidal silica particles.

While shown as including multiple layers on one (for example, a top) side of woven fiber layer 102, first resin layer 104 and third resin layer 108 may comprise a single layer of resin and/or other material. In some embodiments, the combination of first resin layer 104 and third resin layer 108 includes a thickness that is less than a thickness of woven fiber layer 102.

In some embodiments, third resin layer 108 and/or fourth resin layer 110 may be part of a commercially available dielectric build-up film, such as a GX-series film from Ajinomoto Fine-Techno Co., Inc. (https://www.aft-website-.com/en/electron/abf), for example. In some embodiments, a covering or supporting layer (not shown), such as a polypropylene film or a poly(ethylene terephthalate) (PET) layer, may cover third resin layer 108 and/or fourth resin layer 110, for example for protection during transport.

While not drawn to scale, in some embodiments fourth resin layer 110 has a thickness greater than a thickness of third resin layer 108. In some embodiments, third resin layer 108 is relatively thin primer layer of resin. In some embodiments, fourth resin layer 110 has a thickness that is at least twice the thickness of third resin layer 108. In some embodiments, fourth resin layer 110 has a thickness of greater than 10 um and third resin layer 108 has a thickness of less than 5 um.

In some embodiments, third resin layer 108 and/or fourth resin layer 110 may be a same resin as or a different resin from first resin layer 104 and second resin layer 106. In some embodiments, third resin layer 108 and/or fourth resin layer 110 may be uncured in that thermal curing has not yet been completed to cure the resin. In some embodiments, third resin layer 108 and/or fourth resin layer 110 may be a semi-cured epoxy resin capable of deforming around interconnects of a routing layer with which it may be placed into contact.

While shown as including multiple layers on one (for example, a bottom) side of woven fiber layer 102, second resin layer 106 and fourth resin layer 110 may comprise a single layer of resin and/or other material. In some embodiments, the combination of second resin layer 106 and fourth resin layer 110 includes a thickness that is greater than a thickness of woven fiber layer 102.

Figure 2:
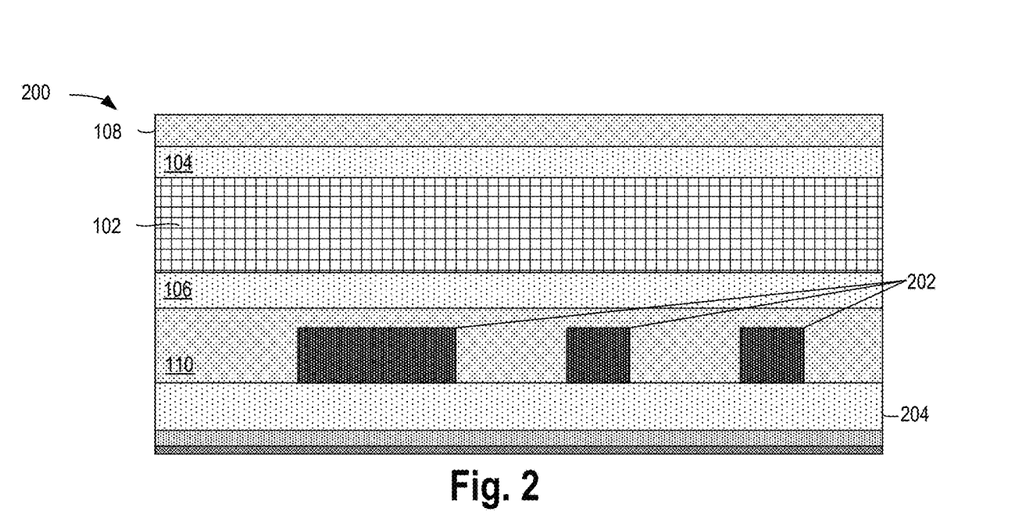
FIG. 2 illustrates a cross-sectional view of a manufacturing step of a device package including a bi-layer prepreg, according to some embodiments.

FIG. 2 illustrates a cross-sectional view of a manufacturing step of a device package including a bi-layer prepreg, according to some embodiments. As shown, assembly 200 includes conductive interconnects 202 and lower substrate layers 204 coupled with prepreg 100.

Conductive interconnects 202 may route signals and power through a substrate. In some embodiments, conductive interconnects 202 are copper, though other metals may be used. In some embodiments, conductive interconnects 202 may have a height of less than 10 um. While shown as having a height less than fourth resin layer 110, in some embodiments conductive interconnects 202 may have a height greater than fourth resin layer 110 and may contact second resin layer 106 with an upper surface.

Lower substrate layers 204 may represent iteratively formed dielectric material insulating metal traces and vias (not shown). In some embodiments, lower substrate layers 204 includes metal, such as copper, that may be plated into etched trenches and vias, then polished back to create metal trenches, planes, and vias, for example to communicate power and signals. Metal interconnects in lower substrate layers 204 may be interspersed with dielectric, which has insulative properties. In some embodiments, a dielectric may represent an interlayer dielectric (ILD) material, such as carbon doped oxide (CDO), deposited across metal structures to a thickness at least equivalent to a thickness of an interconnect structure including wiring lines and subsequent level conductive vias.

In some embodiments, lower substrate layers 204 may include additional layers of prepreg material, such as prepreg 100. Lower substrate layers 204 may be consistent in thickness or may vary in thickness. In some embodiments, lower substrate layers 204 include solder resist or solder mask to protect copper traces against oxidation and to prevent solder bridges from forming between closely spaced solder pads. In some embodiments, lower substrate layers 204 include a layer of liquid epoxy that is sprayed or silkscreened on to an adjacent metal layer and then cured.

Figure 3:
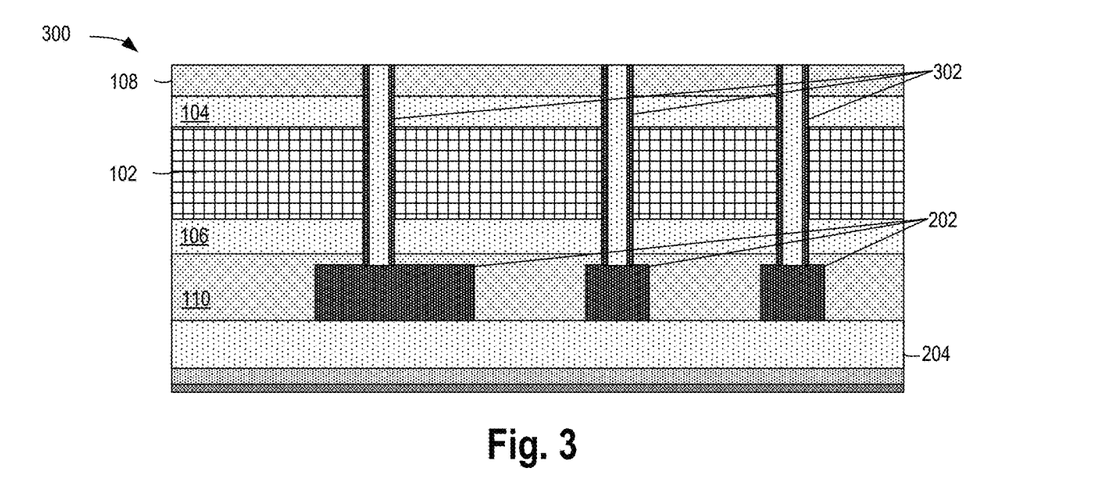
FIG. 3 illustrates a cross-sectional view of a manufacturing step of a device package including a bi-layer prepreg, according to some embodiments.

FIG. 3 illustrates a cross-sectional view of a manufacturing step of a device package including a bi-layer prepreg, according to some embodiments. As shown, assembly 300 includes vias 302 after further processing of assembly 200. Vias 302 may be formed by any suitable technique, including, but not limited to, laser ablation or chemical etchant. In some embodiments, vias 302 include metal plating along the sidewalls of openings formed in prepreg 100 to conductively couple with conductive interconnects 202. In some embodiments, vias 302 include copper plating, while in other embodiments, vias 302 may include plating with nickel, tungsten, titanium, chromium or other metals. While shown has having vertical side walls, in some embodiments vias 302 may have sloped side walls. In some embodiments, vias 302 may have a diameter of less than 50 um.

Figure 4:
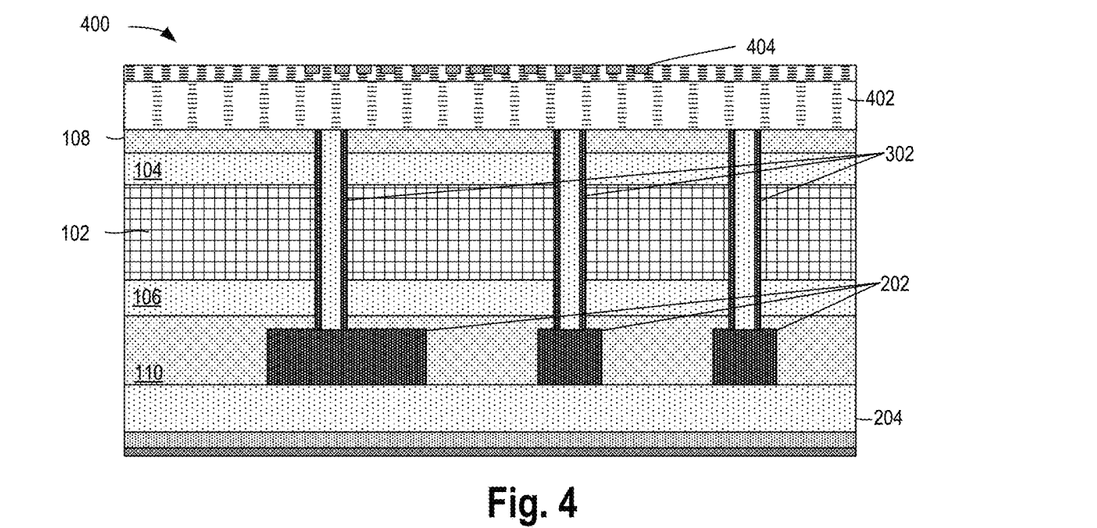
FIG. 4 illustrates a cross-sectional view of a manufacturing step of a device package including a bi-layer prepreg, according to some embodiments.

FIG. 4 illustrates a cross-sectional view of a manufacturing step of a device package including a bi-layer prepreg, according to some embodiments. As shown, assembly 400 includes upper substrate layers 402 and substrate contacts 404 after further processing of assembly 300.

Upper substrate layers 402 may represent iteratively formed dielectric material insulating metal traces (such as substrate contacts 404) and vias (not shown). In some embodiments, upper substrate layers 402 includes metal, such as copper, that may be plated into etched trenches and vias, then polished back to create metal trenches, planes, and vias, for example to communicate power and signals. Metal interconnects in upper substrate layers 402 may be interspersed with dielectric, which has insulative properties. In some embodiments, a dielectric may represent an interlayer dielectric (ILD) material, such as carbon doped oxide (CDO), deposited across metal structures to a thickness at least equivalent to a thickness of an interconnect structure including wiring lines and subsequent level conductive vias.

In some embodiments, upper substrate layers 402 may include additional layers of prepreg material, such as prepreg 100. Upper substrate layers 402 may be consistent in thickness or may vary in thickness. In some embodiments, upper substrate layers 402 include solder resist or solder mask to protect copper traces against oxidation and to prevent solder bridges from forming between closely spaced solder pads. In some embodiments, upper substrate layers 402 include a layer of liquid epoxy that is sprayed or silkscreened on to an adjacent metal layer and then cured.

Figure 5:
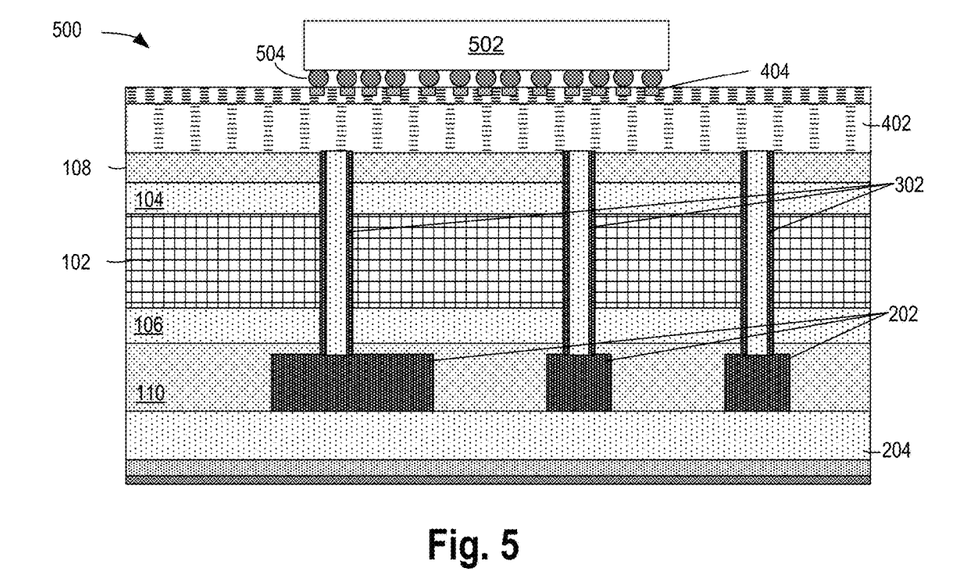
FIG. 5 illustrates a cross-sectional view of a manufacturing step of a device package including a bi-layer prepreg, according to some embodiments.

FIG. 5 illustrates a cross-sectional view of a manufacturing step of a device package including a bi-layer prepreg, according to some embodiments. As shown, assembly 500 includes integrated circuit device 502 and device contacts 504 after further processing of assembly 400. While shown as a single device, integrated circuit device 502 may be multiple device packages. In some embodiments, integrated circuit device 502 may represent a die or die stack. In some embodiments, integrated circuit device 502 may represent two or more dies that are coupled in-situ, however any number of dies may be used and may be pre-coupled as part of another manufacturing process. In some embodiments, integrated circuit device 502 may include one or more processors, field programmable gate arrays (FPGAs), co-processors, controllers, memories and/or other integrated circuit devices. In some embodiments, device contacts 504 may represent controlled collapse chip connection (C4) bumps, solder spheres, or other forms of contacts to couple with substrate contacts 404.

Figure 6:
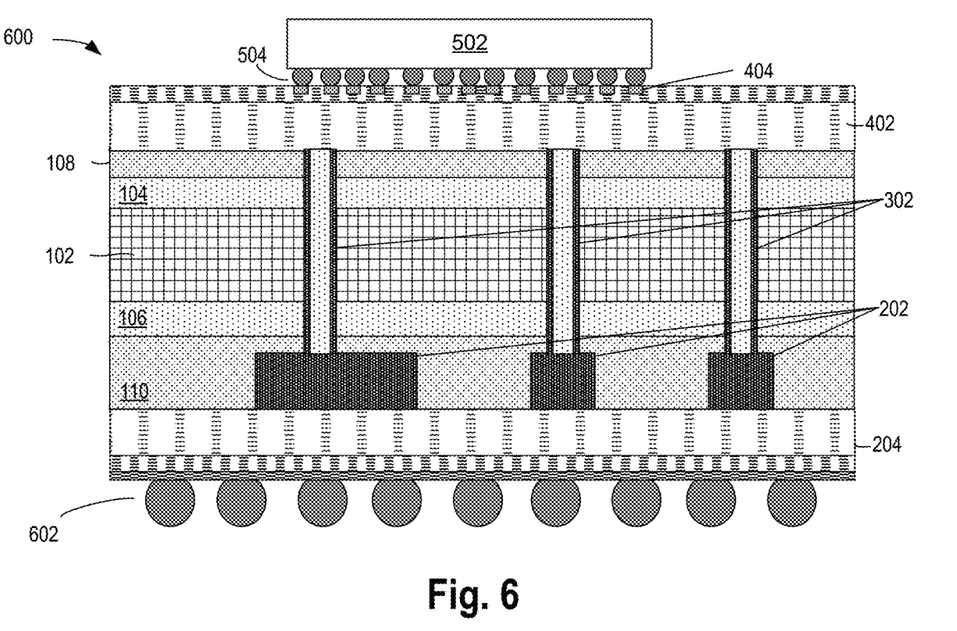
FIG. 6 illustrates a cross-sectional view of a manufacturing step of a device package including a bi-layer prepreg, according to some embodiments.

FIG. 6 illustrates a cross-sectional view of a manufacturing step of a device package including a bi-layer prepreg, according to some embodiments. As shown, assembly 600 includes package contacts 602 after further processing of assembly 500. In some embodiments, package contacts 602 may include solder spheres or other conductive contacts to allow assembly 600 to be coupled with a printed circuit board, for example, as part of an integrated system. In some embodiments, pins, lands, or pads may be used. Package contacts 602 may be made from tin-based solder, lead-based solder, or other conductive materials. While referred to based on a general shape, package contacts 602 may not be completely or perfectly spherical. One skilled in the art would appreciate that the term sphere is used informally and that other shapes/forms may be used.

Figure 7:
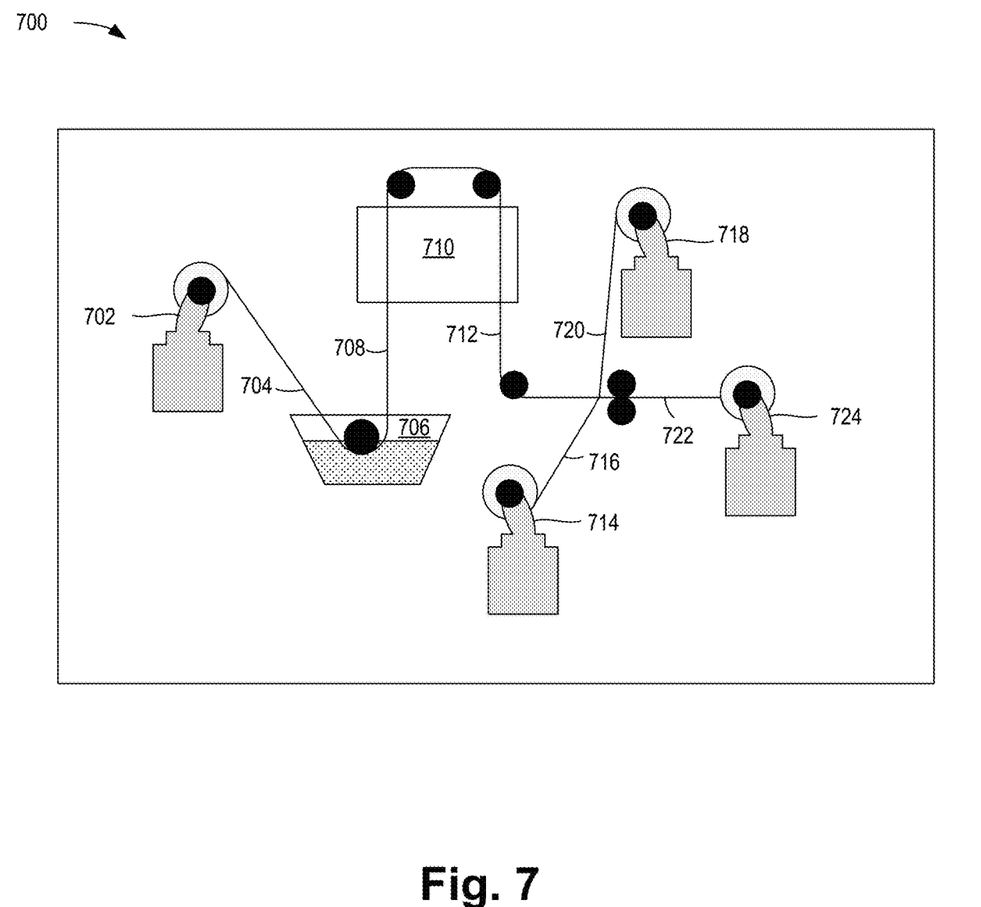
FIG. 7 illustrates an example assembly line for manufacturing a bi-layer prepreg, according to some embodiments.

FIG. 7 illustrates an example assembly line for manufacturing a bi-layer prepreg, according to some embodiments. As shown, apparatus 700 includes woven fiber roll 702, woven fiber 704, resin dip tank 706, uncured fiber composite 708, heater 710, cured fiber composite 712, thick resin roll 714, thick resin film 716, thin resin roll 718, thin resin film 720, bi-layer prepreg 722, and bi-layer prepreg roll 724. While shown as including rolls of materials, in some embodiments, sheets or sleeves or other configurations may be used.

In some embodiments, woven fiber 704 may correspond with woven fiber layer 102 of prepreg 100 and may comprise fiberglass or carbon fiber or Kevlar, for example. In some embodiments, resin dip tank 706 may impregnate woven fiber 704 with a resin, such as an epoxy, to form first resin layer 104 and second resin layer 106, for example, on opposite sides of woven fiber layer 102. In some embodiments, resin dip tank 706 may be replaced with sprayers, brushes, or other means of applying resin. In some embodiments, uncured fiber composite 708 may pass one or more times through heater 710 to cure a thermoset epoxy, forming cured fiber composite 712.

In some embodiments, thick resin film 716 and thin resin film 720 may correspond to fourth resin layer 110 and third resin layer 108, respectively, and may be rolled and pressed onto one side of cured fiber composite 712 to form bi-layer prepreg 722. While shown as being applied as rolled film, in some embodiments, thick resin film 716 and/or thin resin film 720 may be applied by dipping, spraying, or other means. In some embodiments, thick resin film 716 and/or thin resin film 720 may include a covering or supporting layer, such as a polypropylene film or a poly(ethylene terephthalate) (PET) layer that is peeled away from the film prior to being pressed against cured fiber composite 712. Additionally, in some embodiments, thick resin film 716 and/or thin resin film 720 may include a covering or supporting layer, that either remains attached to, or is peeled away from, bi-layer prepreg 722 that is rolled into bi-layer prepreg roll 724.

Figure 8:
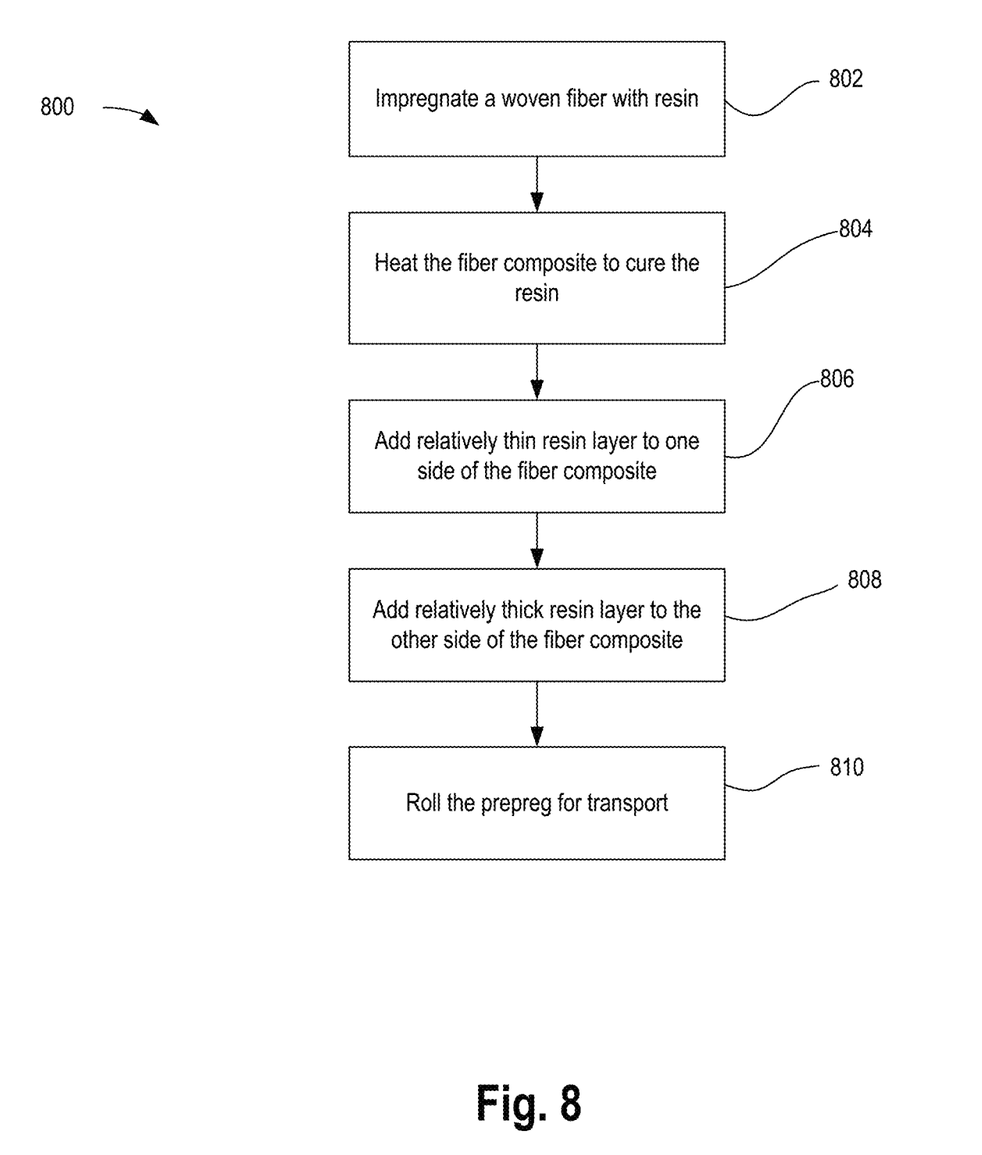
FIG. 8 illustrates a flowchart of a method of forming a bi-layer prepreg, in accordance with some embodiments

FIG. 8 illustrates a flowchart of a method of forming a bi-layer prepreg, in accordance with some embodiments. Although the blocks in the flowchart with reference to FIG. 8 are shown in a particular order, the order of the actions can be modified. Thus, the illustrated embodiments can be performed in a different order, and some actions/blocks may be performed in parallel. Some of the blocks and/or operations listed in FIG. 8 are optional in accordance with certain embodiments. The numbering of the blocks presented is for the sake of clarity and is not intended to prescribe an order of operations in which the various blocks must occur. Additionally, operations from the various flows may be utilized in a variety of combinations.

Method 800 begins with impregnating (802) a woven fiber with resin. In some embodiments, a glass cloth, such as woven fiber 704, is run through resin dip tank 706 to impregnate the woven fiber with uncured resin and create first resin layer 104 and second resin layer 106 on opposite sides of woven fiber layer 102.

Next, the fiber composite is heated (804) to cure the resin. In some embodiments, uncured fiber composite 708 may pass one or more times through heater 710 to cure a thermoset epoxy, forming cured fiber composite 712.

Then, a relatively thin resin layer may be added (806) to one side of the fiber composite. In some embodiments, the third resin layer 108 may be part of a dielectric build-up film. In some embodiments, the third resin layer 108 may not be required, for example where first resin layer 104 provides adequate dielectric coverage of woven fiber 102. Next, a relatively thick resin layer is added (808) to the primer layer. In some embodiments, fourth resin layer 110 may be part of a commercially available dielectric build-up film. In some embodiments, fourth resin layer 110 is semi-cured or semi-solid epoxy resin that has viscosity to fill in voids of an interconnect routing layer.

The method concludes with rolling (810) the prepreg for transport. In some embodiments, a poly(ethylene terephthalate) (PET) layer is included on one or both sides of the prepreg for transport.

Figure 9:
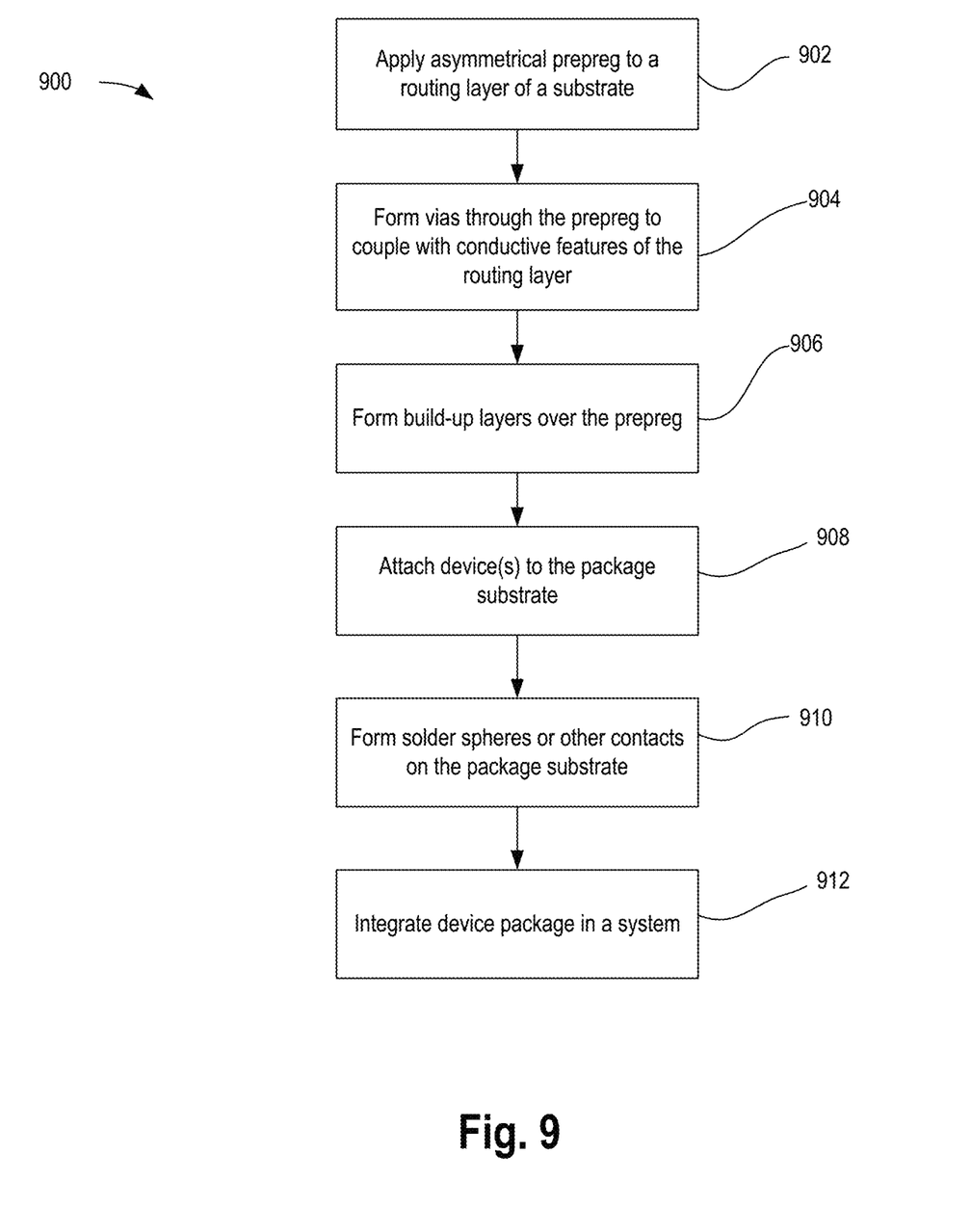
FIG. 9 illustrates a flowchart of a method of forming a device package including a bi-layer prepreg, in accordance with some embodiments.

FIG. 9 illustrates a flowchart of a method of forming a device package including a bi-layer prepreg, in accordance with some embodiments. Although the blocks in the flowchart with reference to FIG. 9 are shown in a particular order, the order of the actions can be modified. Thus, the illustrated embodiments can be performed in a different order, and some actions/blocks may be performed in parallel. Some of the blocks and/or operations listed in FIG. 9 are optional in accordance with certain embodiments. The numbering of the blocks presented is for the sake of clarity and is not intended to prescribe an order of operations in which the various blocks must occur. Additionally, operations from the various flows may be utilized in a variety of combinations.

Method 900 begins with applying (902) an asymmetrical prepreg to a routing layer of a substrate. In some embodiments, a bi-layer prepreg 100 is applied to conductive interconnects 202 with fourth resin layer 110 flowing into voids around conductive interconnects 202. In some embodiments, fourth resin layer 110 contacts conductive interconnects on a top and two lateral surfaces. In some embodiments, conductive interconnects 202 extend through fourth resin layer 110 and contact second resin layer 106 on a top surface.

Next, vias are formed (904) through the prepreg to couple with conductive features of the routing layer. In some embodiments, vias 302 are formed by laser drilling or other suitable methods. In some embodiments, vias 302 include vertical sidewalls that are plated and conductively couple with conductive interconnects 202.

Then, build-up layers are formed (906) over the prepreg. In some embodiments, upper substrate layers 402 may include multiple layers of prepreg 100 or other dielectric film. Next, an integrated circuit device is attached (908) to the package substrate. In some embodiments, integrated circuit device 502 may be a single die or a stack of dies.

The method continues with forming (910) solder spheres or other contacts on the package substrate. In some embodiments, package contacts 602 may represent ball grid array (BGA) contacts. Finally, the device package may be integrated (912) into a system, such as being socketed or soldered to a printed circuit board, in some embodiments.

Figure 10:
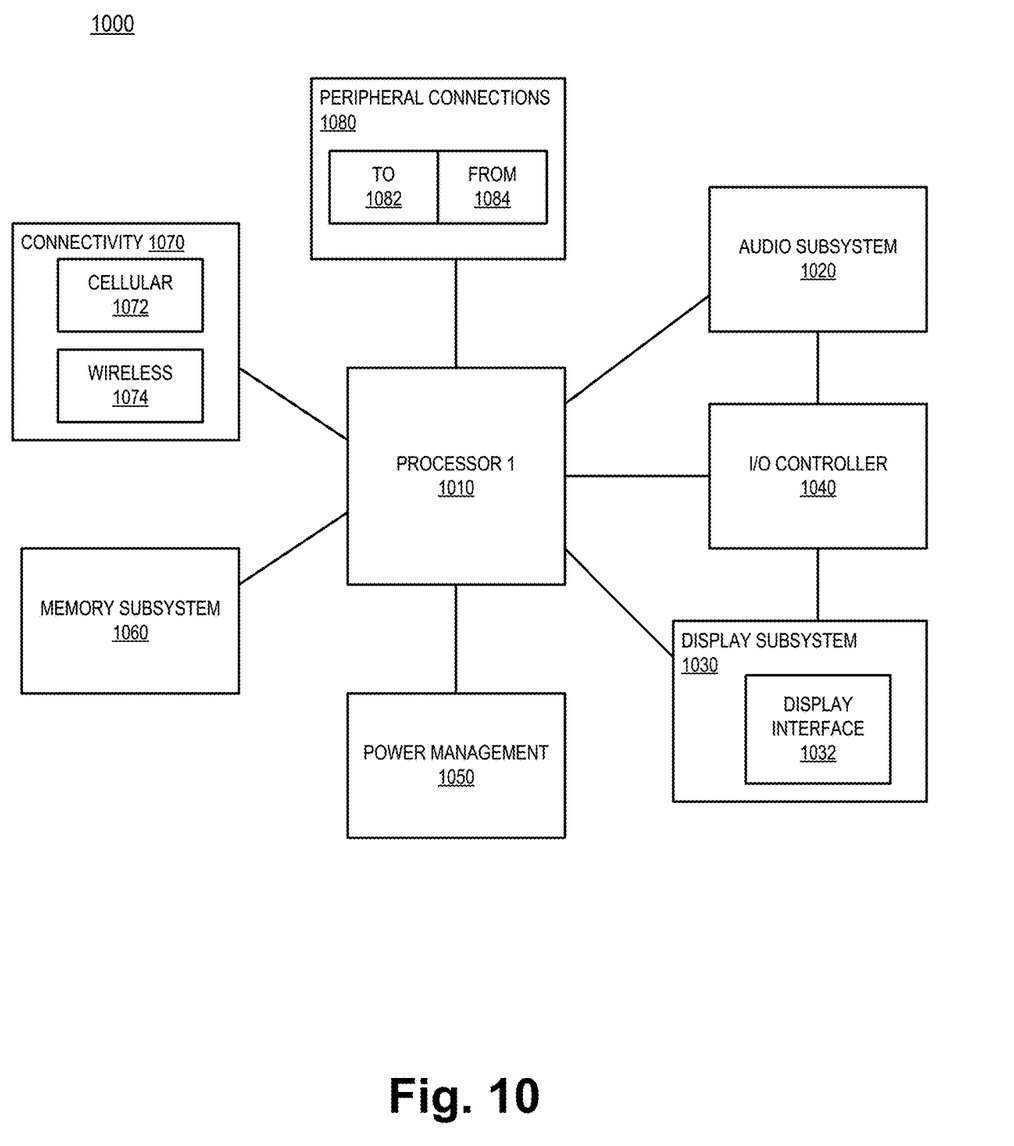
FIG. 10 illustrates a smart device or a computer system or a SoC (System-on-Chip) which includes a device package including a bi-layer prepreg, according to some embodiments.

FIG. 10 illustrates a smart device or a computer system or a SoC (System-on-Chip) 1000 which includes a device package including a bi-layer prepreg, according to some embodiments. In some embodiments, computing device 1000 represents a mobile computing device, such as a computing tablet, a mobile phone or smart-phone, a wireless-enabled e-reader, or other wireless mobile device. It will be understood that certain components are shown generally, and not all components of such a device are shown in computing device 1000. In some embodiments, one or more components of computing device 1000, for example processor 1010 and/or memory subsystem 1060, are included in a package including a bi-layer prepreg as described above.

For purposes of the embodiments, the transistors in various circuits and logic blocks described here are metal oxide semiconductor (MOS) transistors or their derivatives, where the MOS transistors include drain, source, gate, and bulk terminals. The transistors and/or the MOS transistor derivatives also include Tri-Gate and FinFET transistors, Gate All Around Cylindrical Transistors, Tunneling FET (TFET), Square Wire, or Rectangular Ribbon Transistors, ferroelectric FET (FeFETs), or other devices implementing transistor functionality like carbon nanotubes or spintronic devices. MOSFET symmetrical source and drain terminals i.e., are identical terminals and are interchangeably used here. A TFET device, on the other hand, has asymmetric Source and Drain terminals. Those skilled in the art will appreciate that other transistors, for example, Bi-polar junction transistors—BJT PNP/NPN, BiCMOS, CMOS, etc., may be used without departing from the scope of the disclosure.

In some embodiments, computing device 1000 includes a first processor 1010. The various embodiments of the present disclosure may also comprise a network interface within 1070 such as a wireless interface so that a system embodiment may be incorporated into a wireless device, for example, cell phone or personal digital assistant.

In one embodiment, processor 1010 can include one or more physical devices, such as microprocessors, application processors, microcontrollers, programmable logic devices, or other processing means. The processing operations performed by processor 1010 include the execution of an operating platform or operating system on which applications and/or device functions are executed. The processing operations include operations related to I/O (input/output) with a human user or with other devices, operations related to power management, and/or operations related to connecting the computing device 1000 to another device. The processing operations may also include operations related to audio I/O and/or display I/O.

In one embodiment, computing device 1000 includes audio subsystem 1020, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into computing device 1000, or connected to the computing device 1000. In one embodiment, a user interacts with the computing device 1000 by providing audio commands that are received and processed by processor 1010.

Display subsystem 1030 represents hardware (e.g., display devices) and software (e.g., drivers) components that provide a visual and/or tactile display for a user to interact with the computing device 1000. Display subsystem 1030 includes display interface 1032, which includes the particular screen or hardware device used to provide a display to a user. In one embodiment, display interface 1032 includes logic separate from processor 1010 to perform at least some processing related to the display. In one embodiment, display subsystem 1030 includes a touch screen (or touch pad) device that provides both output and input to a user.

I/O controller 1040 represents hardware devices and software components related to interaction with a user. I/O controller 1040 is operable to manage hardware that is part of audio subsystem 1020 and/or display subsystem 1030. Additionally, I/O controller 1040 illustrates a connection point for additional devices that connect to computing device 1000 through which a user might interact with the system. For example, devices that can be attached to the computing device 1000 might include microphone devices, speaker or stereo systems, video systems or other display devices, keyboard or keypad devices, or other I/O devices for use with specific applications such as card readers or other devices.

As mentioned above, I/O controller 1040 can interact with audio subsystem 1020 and/or display subsystem 1030. For example, input through a microphone or other audio device can provide input or commands for one or more applications or functions of the computing device 1000. Additionally, audio output can be provided instead of, or in addition to display output. In another example, if display subsystem 1030 includes a touch screen, the display device also acts as an input device, which can be at least partially managed by I/O controller 1040. There can also be additional buttons or switches on the computing device 1000 to provide I/O functions managed by I/O controller 1040.

In one embodiment, I/O controller 1040 manages devices such as accelerometers, cameras, light sensors or other environmental sensors, or other hardware that can be included in the computing device 1000. The input can be part of direct user interaction, as well as providing environmental input to the system to influence its operations (such as filtering for noise, adjusting displays for brightness detection, applying a flash for a camera, or other features).

In one embodiment, computing device 1000 includes power management 1050 that manages battery power usage, charging of the battery, and features related to power saving operation. Memory subsystem 1060 includes memory devices for storing information in computing device 1000. Memory can include nonvolatile (state does not change if power to the memory device is interrupted) and/or volatile (state is indeterminate if power to the memory device is interrupted) memory devices. Memory subsystem 1060 can store application data, user data, music, photos, documents, or other data, as well as system data (whether long-term or temporary) related to the execution of the applications and functions of the computing device 1000.

Elements of embodiments are also provided as a machine-readable medium (e.g., memory 1060) for storing the computer-executable instructions. The machine-readable medium (e.g., memory 1060) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

Connectivity 1070 includes hardware devices (e.g., wireless and/or wired connectors and communication hardware) and software components (e.g., drivers, protocol stacks) to enable the computing device 1000 to communicate with external devices. The computing device 1000 could be separate devices, such as other computing devices, wireless access points or base stations, as well as peripherals such as headsets, printers, or other devices.

Connectivity 1070 can include multiple different types of connectivity. To generalize, the computing device 1000 is illustrated with cellular connectivity 1072 and wireless connectivity 1074. Cellular connectivity 1072 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 1074 refers to wireless connectivity that is not cellular, and can include personal area networks (such as Bluetooth, Near Field, etc.), local area networks (such as Wi-Fi), and/or wide area networks (such as WiMax), or other wireless communication.

Peripheral connections 1080 include hardware interfaces and connectors, as well as software components (e.g., drivers, protocol stacks) to make peripheral connections. It will be understood that the computing device 1000 could both be a peripheral device ("to" 1082) to other computing devices, as well as have peripheral devices ("from" 1084) connected to it. The computing device 1000 commonly has a "docking" connector to connect to other computing devices for purposes such as managing (e.g., downloading and/or uploading, changing, synchronizing) content on computing device 1000. Additionally, a docking connector can allow computing device 1000 to connect to certain peripherals that allow the computing device 1000 to control content output, for example, to audiovisual or other systems.

In addition to a proprietary docking connector or other proprietary connection hardware, the computing device 1000 can make peripheral connections 1080 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art).

Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following examples pertain to further embodiments. Specifics in the examples may be used anywhere in one or more embodiments. All optional features of the apparatus described herein may also be implemented with respect to a method or process.

In one example, an apparatus is presented comprising: a fiber layer, a first resin layer on a first surface of the fiber layer, a second resin layer on a second surface of the fiber layer, the second surface opposite the first surface, and the first and the second resin layers comprising cured resin, a third resin layer on the first resin layer, and a fourth resin layer on the second resin layer, the third and the fourth resin layers comprising an uncured resin, and wherein the fourth resin layer has a thickness greater than a thickness of the third resin layer.

In some embodiments, the thickness of the fourth resin layer is at least twice the thickness of the third resin layer. In some embodiments, the thickness of the third resin layer is less than 5 um, and wherein the thickness of the fourth resin layer is greater than 10 um. Some embodiments also include a layer of polyethylene terephthalate (PET) on the third or fourth resin layers. In some embodiments, the third and the fourth resin layers comprise a semi-cured resin. Some embodiments also include the fourth resin layer on a metal feature of a substrate. In some embodiments, the fiber layer comprises a #1010 weave fiberglass. In some embodiments, the third and the fourth resin layers comprise a pre-formed film comprising epoxy with silica-based filler particles.

In another example, an integrated circuit package is presented comprising: a substrate comprising: a fiber layer, a first resin layer on a first surface of the fiber layer, a second resin layer on a second surface of the fiber layer, the second surface opposite the first surface, and the first and the second resin layers comprising an epoxy resin, a third resin layer on the first resin layer, a fourth resin layer on the second resin layer, the fourth resin layer having a thickness greater than the third resin layer, a conductive interconnect on a substrate surface, the conductive interconnect contacting the fourth resin layer on two or more sides, and a via through the fiber, the first, the second, the third, and the fourth resin layers, the via coupled with the conductive interconnect, and one or more integrated circuit die(s) coupled with the substrate.

In some embodiments, the first and the second resin layers each have a thickness less than a height of the conductive interconnect, and wherein the height of the conductive interconnect is less than 10 um. In some embodiments, the thickness of the fourth resin layer is at least twice the thickness of the third resin layer. In some embodiments, the fiber, the first, the second, the third, and the fourth resin layers have a total thickness of less than 40 um. In some embodiments, the first, the second, the third, and the fourth resin layers comprise a thermoset epoxy resin with silica-based filler particles. In some embodiments, the fiber comprises a #1010 weave fiberglass.

In another example, a system is presented comprising: a display subsystem, a wireless communication interface, and an integrated circuit package, the integrated circuit package comprising: a substrate comprising: a fiber layer, a first resin layer on a first surface of the fiber layer, a second resin layer on a second surface of the fiber layer, the second surface opposite the first surface, and the first and the second resin layers comprising an epoxy resin, a third resin layer on the first resin layer, a fourth resin layer on the second resin layer, the fourth resin layer having a thickness greater than the third resin layer, a conductive interconnect on a substrate surface, the conductive interconnect contacting the fourth resin layer on two or more sides, and a via through the fiber, the first resin, the second resin, the third resin, and the fourth resin layers, the via coupled with the conductive interconnect, and one or more integrated circuit die(s) coupled with the substrate.

In some embodiments, the thickness of the fourth resin layer is at least twice the thickness of the third resin layer. In some embodiments, the thickness of the third resin layer is less than 5 um, and wherein the thickness of the fourth resin layer is greater than 10 um. Some embodiments also include the fiber, the first resin, the second resin, the third resin, and the fourth resin layers having a total thickness of less than 40 um. In some embodiments, the first, the second, the third, and the fourth resin layers comprise a thermoset epoxy resin with silica-based filler particles. In some embodiments, the fiber layer comprises a #1010 weave fiberglass.

In another example, a method of forming a bi-layer prepreg is presented comprising: impregnating a fiber with resin, forming a first resin layer on a first side of the fiber, wherein the first resin layer has a thickness less than a thickness of the fiber, and forming a second resin layer on a second side of the fiber, the second side of the fiber is opposite the first side of the fiber, and wherein the second resin layer has a thickness greater than the thickness of the fiber.

In some embodiments, impregnating the fiber with resin comprises: dipping the fiber in a liquid epoxy, and heating the fiber composite. In some embodiments, the liquid epoxy comprises an epoxy resin with silica-based filler particles. In some embodiments, forming the second resin layer comprises: peeling a cover layer off a build-up film to expose a resin layer, applying the resin layer of the build-up film to the second side of the impregnated fiber, and pressing the build-up film against the impregnated fiber with mechanical rollers. Some embodiments also include rolling the bi-layer prepreg on a spool. In some embodiments, the fiber comprises fiberglass fabric. Some embodiments also include peeling a layer of polyethylene terephthalate (PET) from the second resin layer.

In another example, a method of forming a device package with a bi-layer prepreg is presented comprising: receiving a coreless substrate having a conductive interconnect over a dielectric surface, and applying a bi-layer prepreg over the coreless substrate, wherein the bi-layer prepreg comprises: a fiber layer, a first resin layer on a first surface of the fiber layer, a second resin layer on a second surface of the fiber layer, the second surface opposite the first surface, and the first and the second resin layers comprising cured resin, a third resin layer on the first resin layer, and a fourth resin layer on the second resin layer, the third and the fourth resin layers comprising an uncured resin, and wherein the fourth resin layer has a thickness greater than a thickness of the third resin layer, wherein applying the bi-layer prepreg over the coreless substrate comprises placing the fourth resin layer in contact with the conductive interconnect.

Some embodiments also include forming a via through the bi-layer prepreg coupled with the conductive interconnect. Some embodiments also include forming build-up layers over the bi-layer prepreg that couple the via with a package substrate contact. Some embodiments also include coupling an integrated circuit device with the package substrate contact. In some embodiments, the third and fourth resin layers comprise an epoxy resin with silica-based filler particles. In some embodiments, the fiber layer comprises fiberglass fabric.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:

1. An apparatus comprising:
   a fiber layer;
   a first resin layer on a first surface of the fiber layer;
   a second resin layer on a second surface of the fiber layer, the second surface opposite the first surface, and the first and the second resin layers comprising cured resin;
   a third resin layer on the first resin layer; and
   a fourth resin layer on the second resin layer, the third and the fourth resin layers comprising an uncured resin, and wherein the fourth resin layer has a thickness greater than a thickness of the third resin layer, wherein the fiber, the first, the second, the third, and the fourth resin layers have a total thickness of less than 40 um.

2. The apparatus of claim 1, wherein the thickness of the fourth resin layer is at least twice the thickness of the third resin layer.

3. The apparatus of claim 2, wherein the thickness of the third resin layer is less than 5 um, and wherein the thickness of the fourth resin layer is greater than 10 um.

4. The apparatus of claim 1, further comprising a layer of polyethylene terephthalate (PET) on the third or fourth resin layers.

5. The apparatus of claim 1, wherein the third and the fourth resin layers comprise a semi-cured resin.

6. The apparatus of claim 1, further comprising the fourth resin layer on a metal feature of a substrate.

7. The apparatus of claim 1, wherein the fiber layer comprises a #1010 weave fiberglass.

8. The apparatus of claim 1, wherein the third and the fourth resin layers comprise a pre-formed film comprising epoxy with silica-based filler particles.

9. An integrated circuit package comprising:
   a substrate comprising:
      a fiber layer;
      a first resin layer on a first surface of the fiber layer;
      a second resin layer on a second surface of the fiber layer, the second surface opposite the first surface, and the first and the second resin layers comprising an epoxy resin;
      a third resin layer on the first resin layer;
      a fourth resin layer on the second resin layer, the fourth resin layer having a thickness greater than the third resin layer, wherein the thickness of the fourth resin layer is at least twice the thickness of the third resin layer;
      a conductive interconnect on a substrate surface, the conductive interconnect contacting the fourth resin layer on two or more sides; and
      a via through the fiber, the first, the second, the third, and the fourth resin layers, the via coupled with the conductive interconnect; and
   one or more integrated circuit die(s) coupled with the substrate.

10. The integrated circuit package of claim 9, wherein the first and the second resin layers each have a thickness less than a height of the conductive interconnect, and wherein the height of the conductive interconnect is less than 10 um.

11. The integrated circuit package of claim 9, wherein the fiber, the first, the second, the third, and the fourth resin layers have a total thickness of less than 40 um.

12. The integrated circuit package of claim 9, wherein the first, the second, the third, and the fourth resin layers comprise a thermoset epoxy resin with silica-based filler particles.

13. The integrated circuit package of claim 9, wherein the fiber comprises a #1010 weave fiberglass.

14. A system comprising:
   a display subsystem;
   a wireless communication interface; and
   an integrated circuit package, the integrated circuit package comprising:
      a substrate comprising:
         a fiber layer;
         a first resin layer on a first surface of the fiber layer;
         a second resin layer on a second surface of the fiber layer, the second surface opposite the first surface, and the first and the second resin layers comprising an epoxy resin;
         a third resin layer on the first resin layer;
         a fourth resin layer on the second resin layer, the fourth resin layer having a thickness greater than the third resin layer;
         a conductive interconnect on a substrate surface, the conductive interconnect contacting the fourth resin layer on two or more sides, wherein the first and the second resin layers each have a thickness less than a height of the conductive interconnect, and wherein the height of the conductive interconnect is less than 10 um; and
         a via through the fiber, the first resin, the second resin, the third resin, and the fourth resin layers, the via coupled with the conductive interconnect; and
      one or more integrated circuit die(s) coupled with the substrate.

15. The system of claim 14, wherein the thickness of the fourth resin layer is at least twice the thickness of the third resin layer.

16. The system of claim 15, wherein the thickness of the third resin layer is less than 5um, and wherein the thickness of the fourth resin layer is greater than 10 um.

17. The system of claim 14, further comprising the fiber, the first resin, the second resin, the third resin, and the fourth resin layers having a total thickness of less than 40 um.

18. The system of claim 14, wherein the first, the second, the third, and the fourth resin layers comprise a thermoset epoxy resin with silica-based filler particles.

19. The system of claim 14, wherein the fiber layer comprises a #1010 weave fiberglass.

* * * * *